(12) United States Patent
Liao

(10) Patent No.: US 12,225,778 B2
(45) Date of Patent: Feb. 11, 2025

(54) DISPLAY SUBSTRATES AND METHODS OF MANUFACTURING THE SAME, DISPLAY PANELS, AND DISPLAY APPARATUSES

(71) Applicants: Hefei BOE Joint Technology Co., Ltd., Anhui (CN); BOE Technology Group Co., Ltd., Beijing (CN)

(72) Inventor: Chinlung Liao, Beijing (CN)

(73) Assignees: Hefei BOE Joint Technology Co., Ltd., Anhui (CN); BOE Technology Group Co., Ltd., Beijing (CN)

(*) Notice: Subject to any disclaimer, the term of this patent is extended or adjusted under 35 U.S.C. 154(b) by 469 days.

(21) Appl. No.: 17/639,777

(22) PCT Filed: Apr. 9, 2021

(86) PCT No.: PCT/CN2021/086112
§ 371 (c)(1),
(2) Date: Mar. 2, 2022

(87) PCT Pub. No.: WO2021/208810
PCT Pub. Date: Oct. 21, 2021

(65) Prior Publication Data
US 2022/0336552 A1    Oct. 20, 2022

(30) Foreign Application Priority Data

Apr. 14, 2020 (CN) .......................... 202010291659.2

(51) Int. Cl.
*H10K 59/122* (2023.01)
*H10K 50/82* (2023.01)
(Continued)

(52) U.S. Cl.
CPC ........... *H10K 59/122* (2023.02); *H10K 50/82* (2023.02); *H10K 71/00* (2023.02); *H10K 59/1201* (2023.02)

(58) Field of Classification Search
None
See application file for complete search history.

(56) References Cited

U.S. PATENT DOCUMENTS

2008/0284323 A1    11/2008    Kashiwabara et al.
2019/0237525 A1    8/2019    Zhao et al.
(Continued)

FOREIGN PATENT DOCUMENTS

CN    101340754 A    1/2009
CN    107393945 A    11/2017
(Continued)

OTHER PUBLICATIONS

CN2020102916592 first office action.
PCT/CN2021/086112 international search report.

*Primary Examiner* — Michelle Mandala
(74) *Attorney, Agent, or Firm* — IPro, PLLC

(57) ABSTRACT

A display substrate includes: a base substrate; a plurality of light-emitting structures provided on the base substrate; and a pixel definition layer provided on the base substrate and having a plurality of pixel openings, the pixel definition layer including a first definition layer and a second definition layer on the first definition layer, and the second definition layer being made of a conductive material, where each of the plurality of light-emitting structures includes a first electrode, a light-emitting material, and a second electrode, the first electrode is provided on the base substrate and located in a respective pixel opening, the light-emitting material is provided on the first electrode, and second electrodes of the plurality of light-emitting structures are provided on the light-emitting material, are structurally integrated, cover the pixel definition layer and are electrically connected with the second definition layer. A display panel, a display apparatus, and a method of manufacturing a display substrate are also disclosed.

17 Claims, 5 Drawing Sheets

(51) Int. Cl.
*H10K 71/00* (2023.01)
*H10K 59/12* (2023.01)

(56) References Cited

U.S. PATENT DOCUMENTS

| | | | |
|---|---|---|---|
| 2019/0245013 A1* | 8/2019 | Yang | H10K 59/122 |
| 2021/0118964 A1 | 4/2021 | Gong et al. | |
| 2021/0343972 A1* | 11/2021 | Zheng | G06F 3/0412 |
| 2021/0359040 A1* | 11/2021 | Xiang | H10K 50/813 |
| 2021/0367184 A1 | 11/2021 | Song | |
| 2022/0052134 A1* | 2/2022 | Zhang | H10K 59/131 |
| 2023/0024214 A1* | 1/2023 | Tong | H10K 59/131 |

FOREIGN PATENT DOCUMENTS

| | | |
|---|---|---|
| CN | 108321175 A | 7/2018 |
| CN | 108470756 A | 8/2018 |
| CN | 109920816 A | 6/2019 |
| CN | 110176478 A | 8/2019 |
| CN | 111463250 A | 7/2020 |

\* cited by examiner

DISPLAY SUBSTRATES AND METHODS OF MANUFACTURING THE SAME, DISPLAY PANELS, AND DISPLAY APPARATUSES

CROSS-REFERENCE TO RELATED APPLICATIONS

This application is the U.S. national phase of PCT Application No. PCT/CN2021/086112 filed on Apr. 9, 2021, which claims priority to Chinese Patent Application No. 202010291659.2 filed on Apr. 14, 2020 and entitled "DISPLAY SUBSTRATES AND METHODS OF MANUFACTURING THE SAME, DISPLAY PANELS, AND DISPLAY APPARATUSES", which is incorporated herein by reference in its entirety.

TECHNICAL FIELD

Embodiments of the present disclosure relate to a display substrate and a method of manufacturing the same, a display panel, and a display apparatus.

BACKGROUND

For top-emission display panels, a thickness of a cathode of a sub-pixel is generally set small in order to enhance the transmittance of light emitted by the sub-pixel.

SUMMARY

At least one embodiment of the present disclosure provides a display substrate, including:
 a base substrate;
 a plurality of light-emitting structures formed on the base substrate; and
 a pixel definition layer provided on the base substrate, the pixel definition layer having a plurality of pixel openings, the pixel definition layer including a first definition layer and a second definition layer on the first definition layer, and the second definition layer being made of a conductive material,
 where each of the plurality of light-emitting structures includes a first electrode, a light-emitting material, and a second electrode, the first electrode is provided on the base substrate and located in a respective pixel opening, the light-emitting material is provided on the first electrode, and second electrodes of the plurality of light-emitting structures are provided on the light-emitting material and are structurally integrated, and the second electrodes cover the pixel definition layer and are electrically connected with the second definition layer.

In an embodiment of the present disclosure, the pixel definition layer further includes a third definition layer located between the first definition layer and the second definition layer and made of a hydrophobic material.

In an embodiment of the present disclosure, the pixel definition layer further includes a third definition layer located on the second definition layer and made of a hydrophobic material, and at least a portion of the second definition layer is exposed from the third definition layer.

In an embodiment of the present disclosure, the second definition layer has an electrical resistivity less than that of the second electrode.

In an embodiment of the present disclosure, the material of the second definition layer is hydrophobic.

In an embodiment of the present disclosure, the first definition layer includes a material that is hydrophilic.

In an embodiment of the present disclosure, the first electrode has a sandwich structure.

In an embodiment of the present disclosure, the sandwich structure includes two indium tin oxide films and a silver film located between the two indium tin oxide films.

In an embodiment of the present disclosure, the second definition layer is made of at least one of copper, silver, gold, or aluminum.

In an embodiment of the present disclosure, the second electrode is made of one of magnesium-silver alloy, indium zinc oxide, and indium tin oxide.

At least one embodiment of the present disclosure provides a display panel including the above display substrate.

At least one embodiment of the present disclosure provides a display apparatus including the above display panel.

At least one embodiment of the present disclosure provides a method of manufacturing a display substrate, including:
 providing a base substrate;
 forming a plurality of first electrodes on the base substrate;
 forming a pixel definition layer on the base substrate, the pixel definition layer including a first definition layer and a second definition layer on the first definition layer, where the pixel definition layer has a plurality of pixel openings which correspond to the plurality of first electrodes one-to-one and expose the plurality of first electrodes, and the second definition layer is made of a conductive material;
 forming a light-emitting material on the plurality of first electrodes, respectively, in the pixel openings; and
 forming a second electrode on the light-emitting material, the second electrode being structurally integrated, covering the pixel definition layer, and being electrically connected with the second definition layer.

In an embodiment of the present disclosure, forming the pixel definition layer on the base substrate includes:
 forming a first definition film on the base substrate, the first definition film covering an entirety of the base substrate;
 forming a second definition film on the first definition film, the second definition film covering an entirety of the first definition film;
 coating a photoresist on the second definition film;
 exposing and developing the photoresist to form photoresist removal areas corresponding to the pixel openings to be formed; and
 etching the second definition film and the first definition film to form the pixel definition layer having the plurality of pixel openings, where the plurality of pixel openings expose the plurality of first electrodes.

In an embodiment of the present disclosure, the pixel definition layer further includes a third definition layer located between the first definition layer and the second definition layer, and forming the pixel definition layer on the base substrate includes:
 forming a first definition film on the base substrate, the first definition film covering an entirety of the base substrate;
 forming a third definition film on the first definition film, the third definition film covering an entirety of the first definition film;
 forming a second definition film on the third definition film, the second definition film covering an entirety of the third definition film;

coating a photoresist on the second definition film, and exposing and developing the photoresist to form photoresist removal areas corresponding to the pixel openings to be formed; and etching the second definition film, the third definition film, and the first definition film, respectively, to form the plurality of pixel openings, where the plurality of pixel openings expose the plurality of first electrodes in a one-to-one correspondence.

In an embodiment of the present disclosure, the pixel definition layer further includes a third definition layer located on the second definition layer, and forming the pixel definition layer on the base substrate includes:

forming a first definition film on the base substrate, the first definition film covering the base substrate;

forming a second definition film on the first definition film, the second definition film covering an entirety of the first definition film;

coating a photoresist on the second definition film, and exposing and developing the photoresist to form photoresist removal areas corresponding to the pixel openings to be formed;

etching the first definition film and the second definition film simultaneously to form the first definition layer and the second definition layer; and forming a third definition film on the second definition layer, and patterning the third definition film to expose at least a portion of the second definition layer.

In an embodiment of the present disclosure, the first definition layer includes a material that is hydrophilic.

In an embodiment of the present disclosure, the material of the second definition layer is hydrophobic.

In an embodiment of the present disclosure, the light-emitting material is formed by an ink-jet printing process.

In an embodiment of the present disclosure, the second definition layer has an electrical resistivity less than that of the second electrode.

Embodiments of the present disclosure provide main technical effects as follows.

According to the embodiments of the present disclosure, a pixel definition layer includes a first definition layer and a second definition layer located on the first definition layer. The second definition layer is made of a conductive material. A second electrode is electrically connected with the second definition layer. In this way, the second definition layer can reduce an electrical resistance of the second electrode, reduce a voltage drop across the second electrode, and thus reduce a difference in current between a central area and an edge area of a display substrate, thereby improving the uniformity of display brightness in different areas of the display substrate, and enhancing the user experience.

DETAILED DESCRIPTION OF THE EMBODIMENTS

Figure 1:
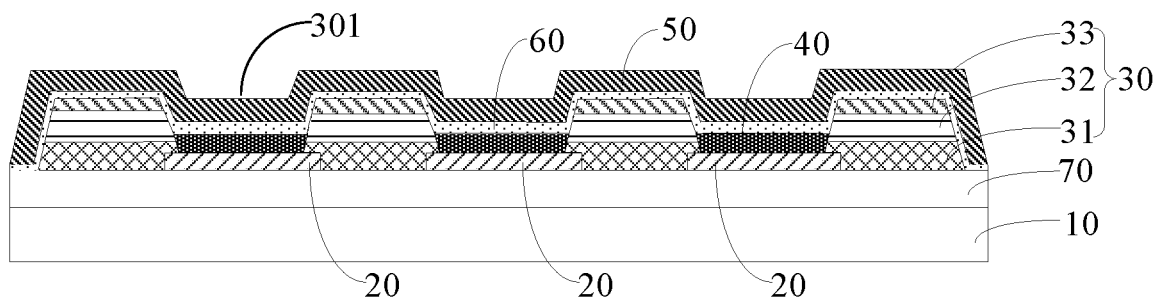
FIG. 1 is a schematic structural diagram illustrating a display substrate according to an exemplary embodiment of the present disclosure.

Exemplary embodiments will be described in detail herein, and examples thereof are illustrated in the drawings. When the following description relates to the drawings, the same numbers in different drawings indicate the same or similar elements, unless otherwise indicated. Embodiments described in the following exemplary embodiments do not represent all embodiments in accordance with the present disclosure. Rather, they are merely examples of apparatuses and methods in accordance with some aspects of the present disclosure as detailed in the appended claims.

Terms used in the present disclosure are only for the purpose of describing specific embodiments, and are not intended to limit the present disclosure. Singular forms of "a", "said", and "the" used in the present disclosure and the appended claims are also intended to include plural forms, unless the context clearly indicates otherwise. It should also be understood that the term "and/or" as used herein refers to and includes any or all possible combinations of one or more of the associated listed items.

It should be understood that though terms "first", "second", "third", etc. may be used in the present disclosure to describe various information, such information should not be limited by these terms. These terms are only used to distinguish the same type of information from each other. For example, without departing from the scope of the present disclosure, first information may also be referred to as second information, and similarly, second information may also be referred to as first information. Depending on the context, the word "if" as used herein may be interpreted as "when", "upon" or "in response to determining".

A display substrate and a method of manufacturing the same, and a display apparatus according to embodiments of the present disclosure will be described in detail below in conjunction with the drawings. Features in the following embodiments may complement each other or be combined with each other without conflict.

In the embodiments of the present disclosure, for the convenience of description, a direction from a base substrate to a first electrode layer is defined as "up", and a direction from the first electrode layer to the base substrate is defined as "down", so as to determine an up-down direction. It is easy to understand that different direction definitions will not affect substantial operation contents of a process and an actual form of a product.

A smaller thickness of a cathode in a top-emission display panel may lead to a larger resistance of the cathode and a larger voltage drop across the cathode, which leads to a larger difference in current between sub-pixels in a central area and an edge area of the display panel, resulting in uneven display brightness of the display panel and a poor user experience.

Figure 2:
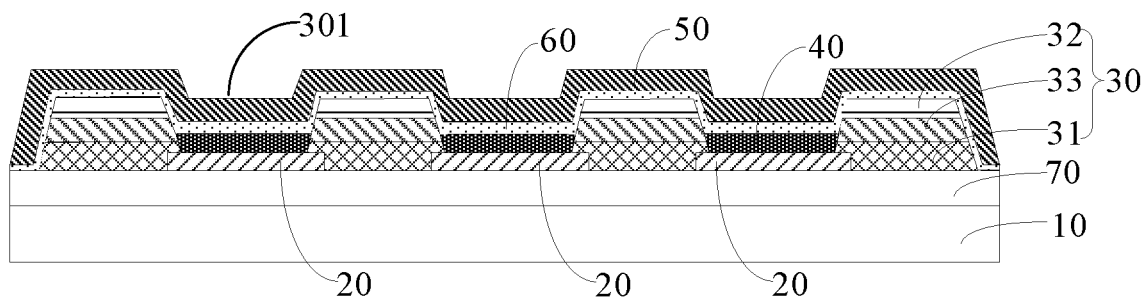
FIG. 2 is a partial sectional view illustrating a display substrate according to an exemplary embodiment of the present disclosure.

At least one embodiment of the present disclosure provides a display substrate. Referring to FIG. 1 and FIG. 2, the display substrate includes a base substrate 10, a pixel definition layer 30, and a plurality of light-emitting structures.

The pixel definition layer 30 is provided on the base substrate 10, and has a plurality of pixel openings 301. The pixel definition layer 30 includes a first definition layer 31 and a second definition layer 32 on the first definition layer 31, and the second definition layer 32 is made of a conductive material.

Each of the plurality of light-emitting structures includes a first electrode 20, a light-emitting material 40, and a second electrode 50. The first electrode 20 is provided on the base substrate 10 and located in the pixel opening 301. The light-emitting material 40 is provided in the pixel opening 301 and located on the first electrode 20. Second electrodes 50 of the plurality of light-emitting structures are provided on the light-emitting material 40 and are structurally integrated, and the second electrodes 50 cover the pixel definition layer 30 and are electrically connected with the second definition layer 32.

The second electrodes 50 covering the pixel definition layer 30 means that the second electrodes 50 cover each pixel opening 301, portions of the pixel definition layer 30 disposed between adjacent pixel openings 301, and portions of the pixel definition layer 30 disposed at an edge thereof.

With a display substrate according to the embodiments of the present disclosure, a pixel definition layer 30 includes a first definition layer 31 and a second definition layer 32 located on the first definition layer 31. The second definition layer 32 is made of a conductive material. A second electrode 50 is electrically connected with the second definition layer 32. In this way, the second definition layer 32 can reduce an electrical resistance of the second electrode 50, reduce a voltage drop across the second electrode 50, and thus reduce a difference in current between a central area and an edge area of the display substrate, thereby improving the uniformity of display brightness in different areas of the display substrate, and enhancing the user experience.

In an embodiment of the present disclosure, the base substrate 10 may be a flexible substrate, which may be made of an organic material such as polyimide.

In some embodiments of the present disclosure, the base substrate 10 may be a rigid substrate, which may be made of a material such as glass, metal, and plastic, for example. In some embodiments of the present disclosure, the first electrode 20 may be an anode, and the second electrode 50 may be a cathode.

In an embodiment of the present disclosure, the pixel definition layer 30 may further include a third definition layer 33 which is made of a hydrophobic material. The third definition layer 33 is disposed above the second definition layer 32 as shown in FIG. 1, or the third definition layer 33 is disposed between the first definition layer 31 and the second definition layer 32 as shown in FIG. 2. In the case of the first definition layer 31 and the second definition layer 32 with a fixed thickness, a depth of the pixel opening 301 may be increased by providing the third definition layer 33 to prevent ink from overflowing the pixel opening 301 when the light-emitting material is formed by an ink-jet printing process. Moreover, since the third definition layer 33 is hydrophobic, it may prevent an uneven thickness of the formed light-emitting material film due to ink climbing and improve uneven film formation of the light-emitting material due to ink climbing.

In the case that the third definition layer 33 is disposed between the second definition layer 32 and the first definition layer 31, the second electrode 50 is electrically connected with top and side portions of the second definition layer 32 such that the second electrode 50 is electrically connected with the second definition layer 32. In the case that the third definition layer 33 is disposed above the second definition layer 32, a distance between an upper surface of the light-emitting material 40 and the base substrate 10 is less than a distance between an upper surface of the second definition layer 32 and the base substrate 10, and at least a portion of a side wall of the second definition layer 32 is electrically connected with the second electrode 50, such that the second definition layer 32 is electrically connected with the second electrode 50.

In an embodiment of the present disclosure, the third definition layer 33 is located above the second definition layer 32, and the third definition layer 33 does not completely cover the second definition layer 32, that is, the second definition layer 32 is exposed. In this way, when the second electrode 50 is formed, it may be ensured that the second electrode 50 is electrically connected with an exposed portion of the second definition layer 32, and that the second electrode 50 is electrically connected with the second definition layer 32.

In an embodiment of the present disclosure, the second definition layer 32 includes a material that is hydrophobic. In the case that the light-emitting material is formed by the ink-jet printing process, the second definition layer 32 can prevent an uneven thickness of the formed light-emitting material film due to ink climbing, further improving the service life and display effect of the display substrate.

In an embodiment of the present disclosure, the third definition layer 33 may be made of polyimide doped with fluorinated resin, or polymethyl methacrylate doped with fluorinated resin. This allows the third definition layer 33 to be more hydrophobic, allowing the ink to flow toward the third definition layer 33 with a greater resistance, and reducing the amount of ink climbing.

In an embodiment of the present disclosure, the first definition layer 31 includes a material that is hydrophilic. In this way, in the case that the light-emitting material is formed by the ink-jet printing process, the ink may be more evenly distributed at the pixel openings 301, which helps to improve the thickness uniformity of the formed light-emitting material film. The material of the first definition layer 31 may include, for example, silicon oxide, silicon nitride, or the like.

In an embodiment of the present disclosure, a side wall of the pixel opening 301 may be a relatively smooth curved surface, and the side wall of the pixel opening 301 extends at an angle in a direction away from that pixel opening 301. That is, no steps are formed between adjacent two of the three layers of the pixel definition layer 30. In this way, the difficulty of climbing the second electrode 50 may be reduced, and the risk of fracture of the second electrode 50 during an evaporation process may be reduced.

In an embodiment of the present disclosure, the first electrode 20 may have a sandwich structure including two indium tin oxide films and a silver film located between the two indium tin oxide films. In other embodiments, the first electrode 20 may be made of other materials.

In an embodiment of the present disclosure, the second definition layer 32 may have an electrical resistivity less than that of the second electrode 50. In this way, providing the second definition layer 32 may effectively reduce the electrical resistance of the second electrode 50, which may effectively mitigate the uneven display brightness of the display substrate caused by the voltage drop.

In an embodiment of the present disclosure, the material of the second definition layer 32 may include at least one of copper, silver, gold, or aluminum. This allows for a lower electrical resistivity of the second definition layer 32, which helps to reduce the electrical resistance of the second electrode 50, and allows for a better hydrophobicity of the second definition layer 32.

In an embodiment of the present disclosure, the second electrode 50 may be made of magnesium-silver alloy, or the second electrode 50 may be made of indium zinc oxide, or indium tin oxide. This allows the second electrode 50 to have a high light transmittance.

In an embodiment of the present disclosure, the display substrate may further include an electron injection layer 60 which is located between the light-emitting material 40 and the second electrode 50 and may be made of sodium fluoride.

In an embodiment of the present disclosure, the electron injection layer 60 covers the pixel definition layer, that is, an orthographic projection of the electron injection layer 60 on the base substrate 10 covers the base substrate 10. The second definition layer 32 is in direct contact with the electron injection layer 60, and is electrically connected with the second electrode 50 through the electron injection layer 60. The electron injection layer 60 and the second electrode 50 may be regarded as a composite electrode. The second definition layer 32 may reduce a total resistance of the composite electrode formed by the electron injection layer 60 and the second electrode 50, and thus reduce the resistance of the second electrode 50, which helps to improve the uniformity of the display brightness of the display substrate.

In another embodiment of the present disclosure, the electron injection layer 60 includes a plurality of electron injection portions corresponding to the pixel openings 301 one-to-one, and the electron injection portions are located in corresponding pixel openings 301. The electron injection portions may improve the capability of electron injection. In the case that the electron injection layer 60 is provided with the plurality of electron injection portions corresponding to the pixel openings 301 one-to-one, and the electron injection portions are located in the corresponding pixel openings 301, the electron injection portions may not cover the side and top portions of the second definition layer 32, and the second definition layer 32 is in direct contact with the second electrode 50.

In an embodiment of the present disclosure, the display substrate may further include an electron transport layer located between the electron injection portions and the light-emitting material 40. The electron transport layer may include electron transport portions provided in a one-to-one correspondence with the plurality of pixel openings 301, with each electron transport portion located in a corresponding pixel opening. Alternatively, the display substrate may not include an electron transport layer. The electron transport layer may be omitted by adding some substances to the light-emitting material to enable the light-emitting material to have the capability of electron transport. In this way, the electron transport layer may not prevent the electrical connection between the second definition layer and the second electrode 50. Compared with the scheme in which the electron transport layer covers the pixel definition layer 30, no breakdown of the electron transport layer is required, which helps to improve the reliability of the display substrate.

In an embodiment, the display substrate includes a hole injection layer and a hole transport layer located between the light-emitting material 40 and the first electrodes 20, with the hole injection layer located between the hole transport layer and the first electrodes 20. The hole injection layer includes a plurality of hole injection portions corresponding to the first electrodes one-to-one, and the hole transport layer includes hole transport portions corresponding to a plurality of electrode blocks one-to-one.

In an embodiment of the present disclosure, the display substrate may further include a pixel circuit layer 70. The pixel circuit layer 70 is provided with a plurality of pixel circuits for driving sub-pixels, and each sub-pixel may correspond to one pixel circuit.

In an embodiment of the present disclosure, the display substrate includes sub-pixels with at least three different colors; for example, the display substrate may include sub-pixels with three colors of red, green and blue. The display substrate separately controls the sub-pixels with different colors to emit light during display, so as to enable color display. Alternatively, the light-emitting structures in the display substrate emit white light, in which case the display substrate further includes color filters located above the second electrode 50, through which color images may be displayed.

Figure 3:
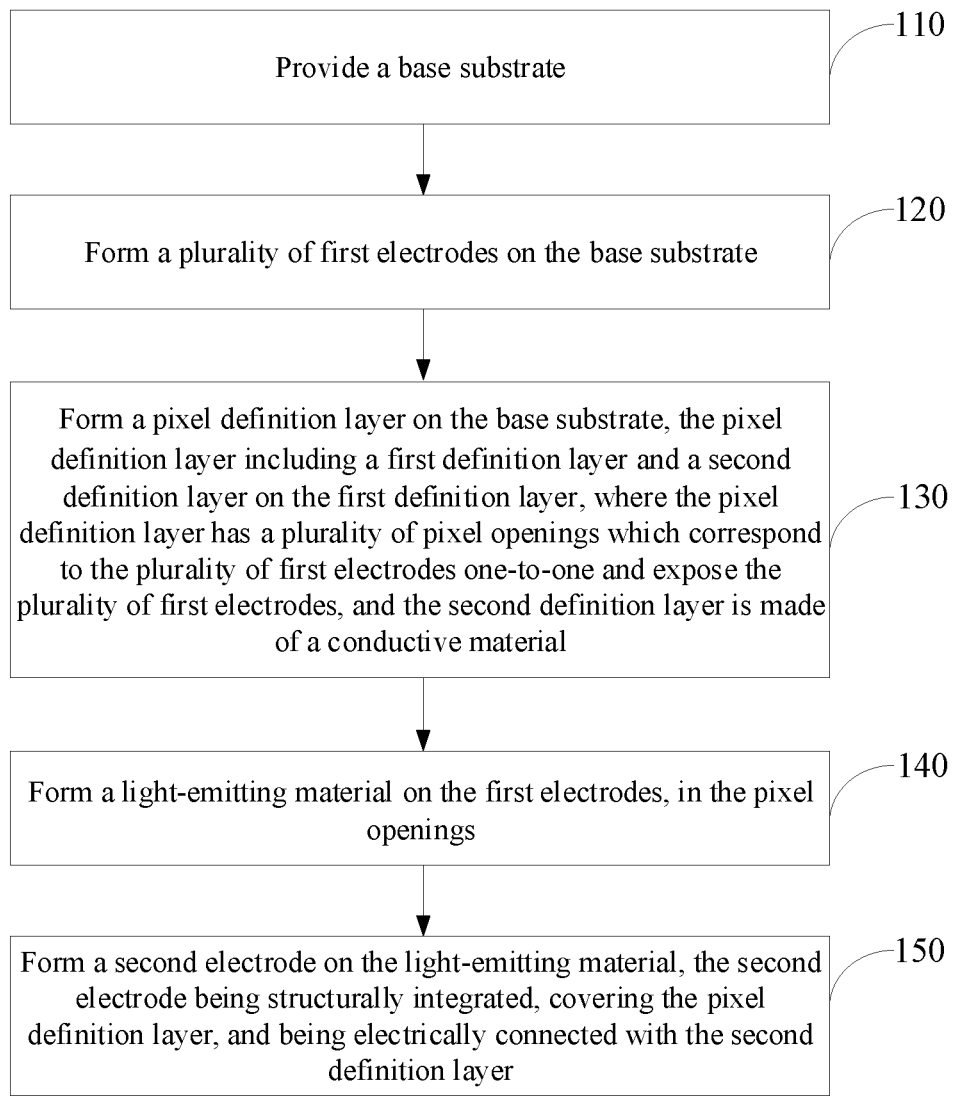
FIG. 3 is a flowchart illustrating a method of manufacturing a display substrate according to an exemplary embodiment of the present disclosure.

Embodiments of the present disclosure further provide a method of manufacturing a display substrate. Referring to FIG. 3, the method of manufacturing the display substrate includes steps S110 to S150 as follows.

At step S110, a base substrate is provided.

In an embodiment of the present disclosure, the base substrate 10 may be a flexible substrate, which may be made of an organic material such as polyimide. In other embodiments, the base substrate 10 may be a rigid substrate, which may be made of a material such as glass, metal, and plastic, for example.

At step S120, a plurality of first electrodes are formed on the base substrate.

In an embodiment of the present disclosure, a first electrode layer is formed on the base substrate, and then the first electrode layer is patterned to form a plurality of first electrodes 20 as anodes of a plurality of light-emitting structures. The plurality of first electrodes 20 are arranged in an array on the base substrate 10.

At step S130, a pixel definition layer is formed on the base substrate, and the pixel definition layer includes a first definition layer and a second definition layer on the first definition layer, where the pixel definition layer has a plurality of pixel openings which correspond to the plurality of first electrodes one-to-one and expose the plurality of first electrodes, and the second definition layer is made of a conductive material.

In an embodiment of the present disclosure, the first definition layer 31 is formed of a hydrophilic material, and the second definition layer 32 is formed of a first hydrophobic material. For example, the hydrophilic material may include silicon oxide, silicon nitride, or the like.

Figure 4:
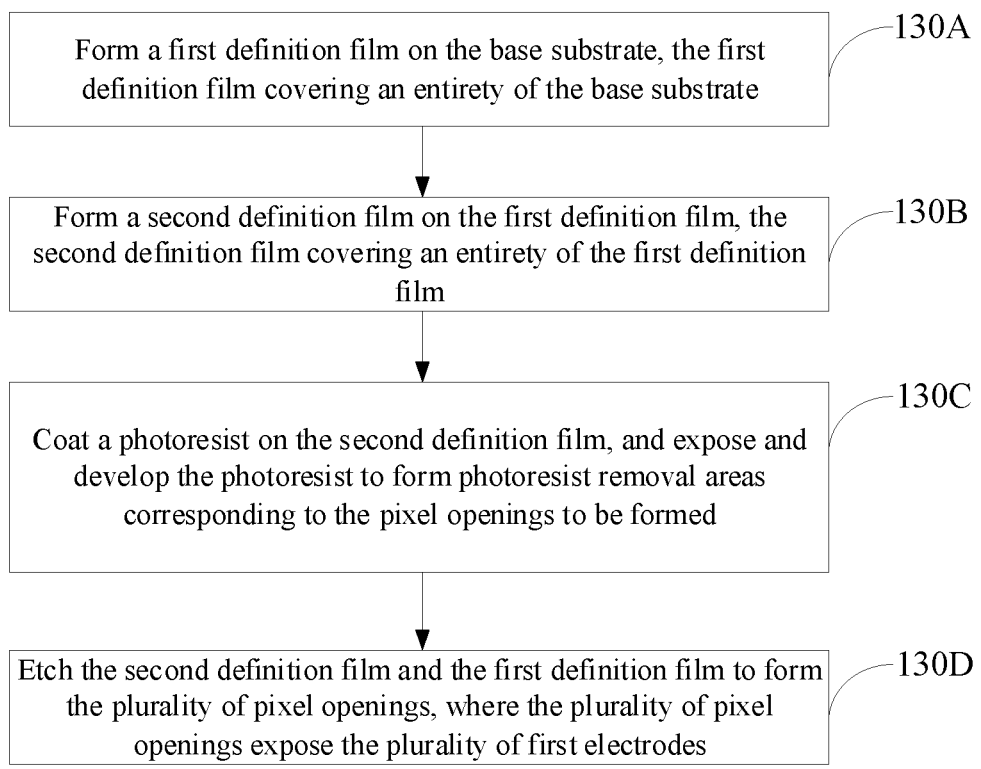
FIG. 4 is a flowchart illustrating a method of manufacturing a display substrate according to another exemplary embodiment of the present disclosure.

In the case that the pixel definition layer includes the first definition layer and the second definition layer, as shown in FIG. 4, forming the pixel definition layer on the base substrate includes:

step S130A, forming a first definition film on the base substrate, the first definition film covering an entirety of the base substrate;

step S130B, forming a second definition film on the first definition film, the second definition film covering an entirety of the first definition film;

step S130C, coating a photoresist on the second definition film, and exposing and developing the photoresist to form photoresist removal areas corresponding to the pixel openings to be formed; and step S130D, etching the second definition film and the first definition film to form the plurality of pixel openings, where the plurality of pixel openings expose the plurality of first electrodes.

In embodiments of the present disclosure, the first definition film, after formed, may be patterned to form the first definition layer, and the second definition film, after formed, may be patterned to form the second definition layer, such that the pixel definition layer may be formed.

In an embodiment of the present disclosure, the pixel definition layer 30 further includes a third definition layer 33 made of a second hydrophobic material. The second hydrophobic material may include polyimide doped with fluorinated resin, or polymethyl methacrylate doped with fluorinated resin.

Figure 5:
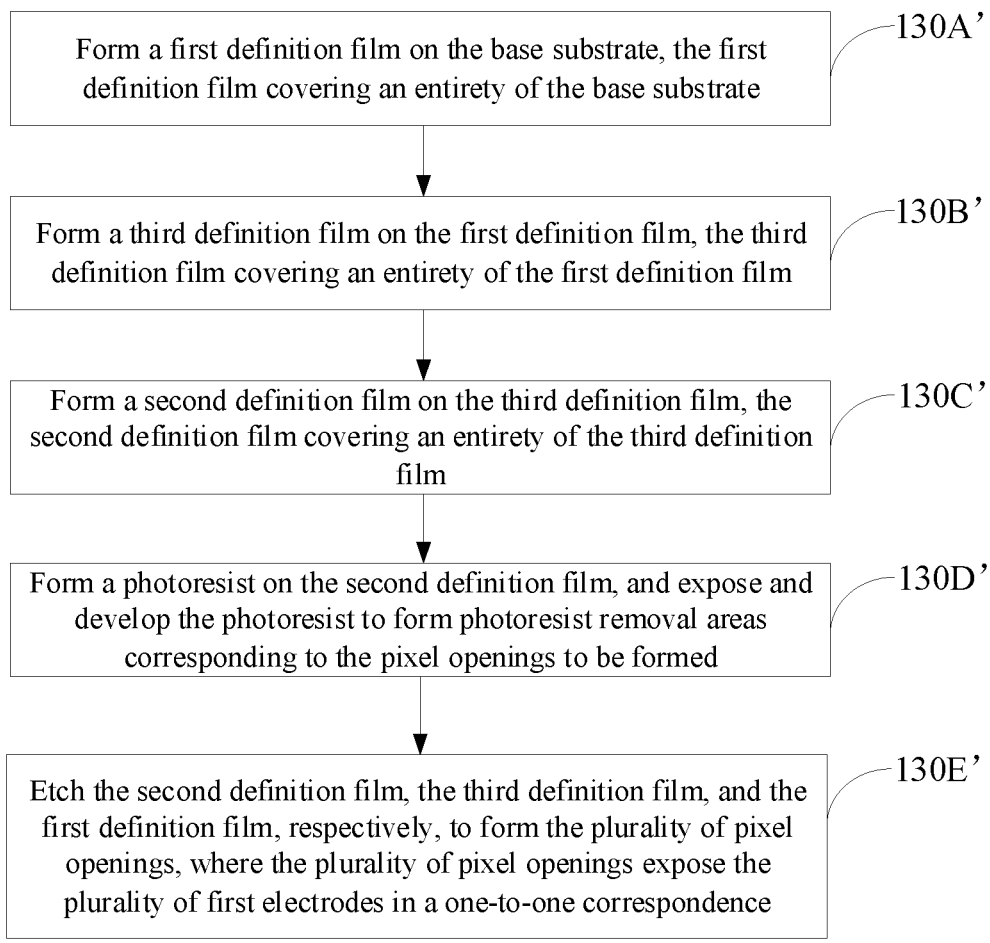
FIG. 5 is a flowchart illustrating a method of manufacturing a display substrate according to yet another exemplary embodiment of the present disclosure.

In an embodiment of the present disclosure, the third definition layer 33 is disposed between the first definition layer and the second definition layer. In this case, referring to FIG. 5, the step S130 of forming the pixel definition layer on the base substrate includes steps S130A' to S130E' as follows.

At step S130A', a first definition film is formed on the base substrate, and the first definition film covers an entirety of the base substrate.

At step S130B', a third definition film is formed on the first definition film, and the third definition film covers an entirety of the first definition film.

At step S130C', a second definition film is formed on the third definition film, and the second definition film covers an entirety of the third definition film.

At step S130D', a photoresist is formed on the second definition film, and the photoresist is exposed and developed to form photoresist removal areas corresponding to the pixel openings to be formed.

At step S130E', the second definition film, the third definition film, and the first definition film are etched, respectively, to form the plurality of pixel openings, where the plurality of pixel openings expose the plurality of first electrodes in a one-to-one correspondence.

In this embodiment, the second definition film, the third definition film, and the first definition film may be etched by using a wet etching process. Since the second definition film, the third definition film, and the first definition film are made of different materials, the second definition film, the third definition film, and the first definition film may be etched with different etching solutions. The material of the second definition film generally includes a metallic material, and the second definition film may be etched with an acidic etching solution. In the case that the material of the third definition film includes polyimide doped with fluorinated resin or polymethyl methacrylate doped with fluorinated resin, the third definition film may be etched with an alkaline etching solution. In the case that the material of the first definition film includes silicon oxide or silicon nitride, the first definition film may be etched with an acidic etching solution.

However, it is also possible to etch each film after it is formed, to form openings in each film. Meanwhile, openings in the first definition film, the second definition film, and the third definition film correspond to each other in position to form the pixel openings located in the pixel definition layer.

Figure 6:
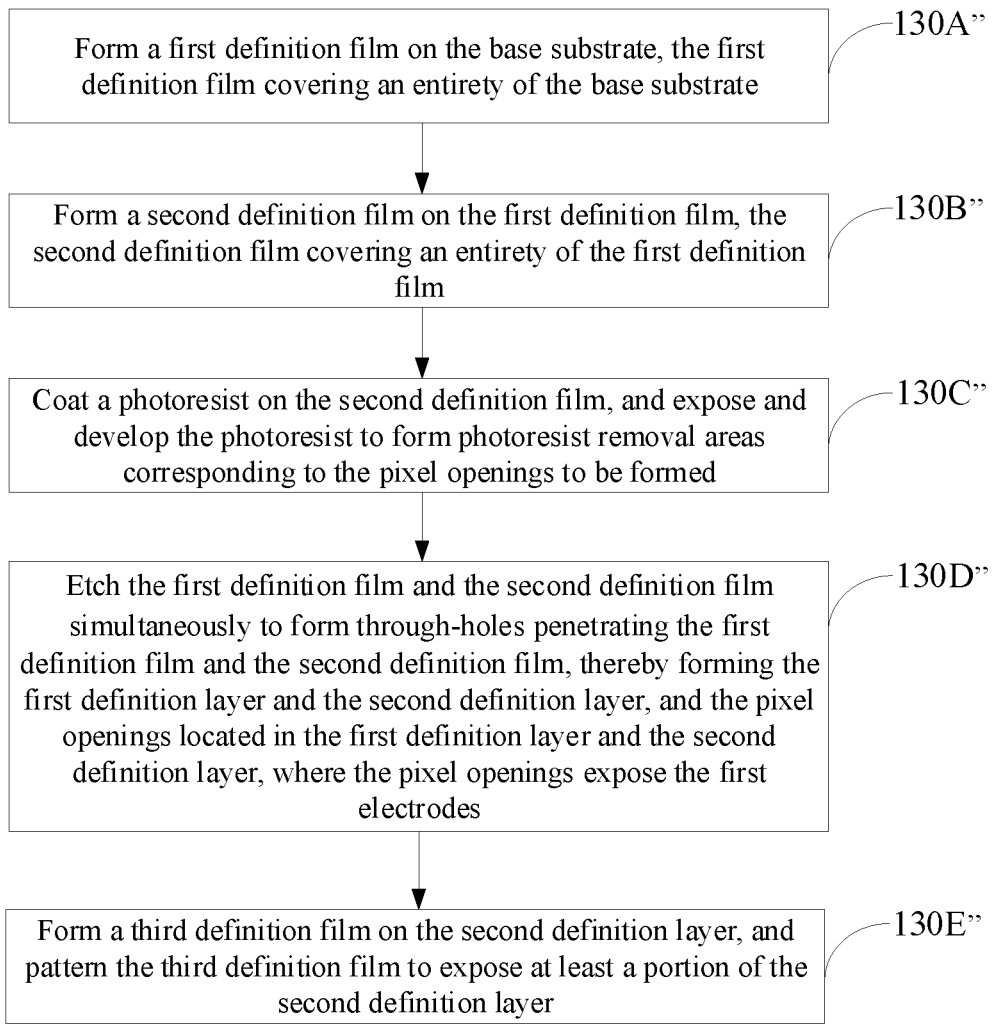
FIG. 6 is a flowchart illustrating a method of manufacturing a display substrate according to still another exemplary embodiment of the present disclosure.

In another embodiment of the present disclosure, the third definition layer is located on the second definition layer, and the first definition layer is made of a hydrophilic material. Referring to FIG. 6, the step 130 of forming the pixel definition layer on the base substrate includes steps S130A" to S130E" as follows.

At step S130A", a first definition film is formed on the base substrate, and the first definition film covers an entirety of the base substrate.

At step S130B", a second definition film is formed on the first definition film, and the second definition film covers an entirety of the first definition film.

At step S130C", a photoresist is coated on the second definition film, and the photoresist is exposed and developed to form photoresist removal areas corresponding to the pixel openings to be formed.

At step S130D", the first definition film and the second definition film are etched simultaneously to form throughholes penetrating the first definition film and the second definition film, thereby forming the first definition layer and the second definition layer, and the pixel openings located in the first definition layer and the second definition layer, where the pixel openings expose the first electrodes.

In an embodiment of the present disclosure, the first definition film and the second definition film may be etched simultaneously by using a wet etching process. Both the first definition film and the second definition film may react with a common etching solution by selecting suitable materials therefor. In the case that the material of the first definition film includes silicon oxide or silicon nitride, and the material of the second definition film includes a metallic material, the first definition film and the second definition film may be etched simultaneously with an acidic etching solution.

At step S130E", a third definition film is formed on the second definition layer, and the third definition film is patterned to expose at least a portion of the second definition layer.

In an embodiment, the third definition film may be etched by using a wet etching process. In the case that the material of the third definition film includes polyimide doped with fluorinated resin or polymethyl methacrylate doped with fluorinated resin, an alkaline etching solution may be used.

At step S140, a light-emitting material is formed on the first electrodes, in the pixel openings. In an embodiment, the light-emitting material may be formed by using an ink-jet printing process. The second definition layer 32 and the third definition layer 33 are hydrophobic, which may improve uneven film formation of the light-emitting material due to ink climbing. Moreover, the first definition layer 31 is hydrophilic, and the ink may be more evenly distributed at the pixel openings 301, which helps to improve the thickness uniformity of the formed light-emitting material film.

At step S150, a second electrode is formed on the light-emitting material, and the second electrode is structurally integrated, covers the pixel definition layer, and is electrically connected with the second definition layer.

In an embodiment of the present disclosure, before the step S150 of forming the second electrode on the light-emitting material, the method of manufacturing the display substrate may further include: forming an electron injection layer on the light-emitting material 40.

In an embodiment of the present disclosure, the electron injection layer 60 covers the pixel definition layer. That is, the electron injection layer 60 covers an entirety of the base substrate 10.

In another embodiment of the present disclosure, the electron injection layer 60 includes a plurality of electron injection portions corresponding to the pixel openings 301 one-to-one, and the electron injection portions are located in corresponding pixel openings.

In an embodiment of the present disclosure, the electron injection layer 60 may be made of sodium fluoride. In an embodiment, the second definition layer 32 has an electrical resistivity less than that of the second electrode 50. The second definition layer 32 may be made of at least one of copper, silver, gold, or aluminum.

In an embodiment of the present disclosure, before forming the first electrode layer on the base substrate, the method of manufacturing the display substrate may further include: forming a pixel circuit layer 70 on the base substrate, and the first electrodes 20 are formed on the pixel circuit layer 70.

For the method embodiment, since it basically corresponds to the product embodiment, the description of the relevant details and beneficial effects may be found in the description of the product embodiment in part, and will not be repeated.

With a display substrate manufactured by a method of manufacturing the display substrate according to the embodiments of the present disclosure, a pixel definition layer 30 includes a first definition layer 31 and a second definition layer 32 located on the first definition layer 31. The second definition layer 32 is made of a conductive material. A second electrode 50 is electrically connected with the second definition layer 32. In this way, the second definition layer 32 can reduce an electrical resistance of the second electrode 50, reduce a voltage drop across the second electrode 50, and thus reduce a difference in current between a central area and an edge area of the display substrate, thereby improving the uniformity of display brightness in different areas of the display substrate, and enhancing the user experience.

At least one embodiment of the present disclosure further provides a display panel including the display substrate according to any of the above embodiments.

In an embodiment of the present disclosure, the display panel may further include an encapsulation layer and a cover plate on a side of the display substrate away from the base substrate 10.

At least one embodiment of the present disclosure further provides a display apparatus including the above display panel. The display apparatus may further include a housing, and the display panel is connected with the housing, for example, the display panel is embedded in the housing. The display apparatus may include, for example, a mobile phone, a tablet computer, a TV, a notebook computer, a digital photo frame, a navigator, and any other device with a display function.

It should be noted that in the drawings, sizes of layers and areas may be exaggerated for clarity of illustration. Furthermore, it may be understood that when an element or layer is referred to as being "on" another element or layer, it may be directly on the other element, or there may be an intermediate layer. Further, it may be understood that when an element or layer is referred to as being "under" another element or layer, it may be directly under the other element, or more than one intermediate layer or element may be present. In addition, it may be understood that when a layer or element is referred to as being "between" two layers or elements, it may be the only layer between the two layers or elements, or more than one intermediate layer or element may be present. Similar reference numerals indicate similar elements throughout.

Other embodiments of the present disclosure will be apparent to those skilled in the art from consideration of the specification and practice of the disclosure disclosed herein. The present disclosure is intended to cover any variations, uses, or adaptive changes of the present disclosure that follow general principles thereof and include common knowledge or conventional technical means in the art that are not disclosed in the present disclosure. The specification and embodiments are considered as exemplary only, with a true scope and spirit of the present disclosure being indicated by the following claims.

It should be understood that the present disclosure is not limited to the precise structures that have been described above and shown in the drawings, and that various modifications and changes may be made without departing from the scope thereof. The scope of the present disclosure is limited only by the appended claims.

The invention claimed is:

1. A display substrate, comprising:
   a base substrate;
   a plurality of light-emitting structures provided on the base substrate; and
   a pixel definition layer provided on the base substrate and having a plurality of pixel openings, the pixel definition layer comprising a first definition layer and a second definition layer on the first definition layer, and the second definition layer being made of a conductive material, wherein the pixel definition layer further comprises a third definition layer located on the second definition layer and made of a hydrophobic material, and at least a portion of the second definition layer is exposed from the third definition layer,
   wherein each of the plurality of light-emitting structures comprises a first electrode, a light-emitting material, and a second electrode, the first electrode is provided on the base substrate and located in a respective pixel opening, the light-emitting material is provided on the first electrode, and second electrodes of the plurality of light-emitting structures are provided on the light-emitting material and are structurally integrated, and the second electrodes cover the pixel definition layer and are electrically connected with the second definition layer.

2. The display substrate of claim 1, wherein the second definition layer has an electrical resistivity less than that of the second electrode.

3. The display substrate of claim 1, wherein the material of the second definition layer is hydrophobic.

4. The display substrate of claim 1, wherein the first definition layer is made of a hydrophilic material.

5. The display substrate of claim 1, wherein the first electrode has a sandwich structure.

6. The display substrate of claim 5, wherein the sandwich structure comprises two indium tin oxide films and a silver film located between the two indium tin oxide films.

7. The display substrate of claim 1, wherein the second definition layer is made of at least one of copper, silver, gold, or aluminum.

8. The display substrate of claim 1, wherein the second electrode is made of one of magnesium-silver alloy, indium zinc oxide, and indium tin oxide.

9. A display panel, comprising the display substrate of claim 1.

10. A display apparatus, comprising the display panel of claim 9.

11. A method of manufacturing a display substrate, comprising:
    providing a base substrate;
    forming a plurality of first electrodes on the base substrate;
    forming a pixel definition layer on the base substrate, the pixel definition layer comprising a first definition layer and a second definition layer on the first definition layer, wherein the pixel definition layer has a plurality of pixel openings which correspond to the plurality of first electrodes one-to-one and expose the plurality of first electrodes, and the second definition layer is made of a conductive material, and wherein the pixel definition layer further comprises a third definition layer located on the second definition layer and made of a hydrophobic material, and at least a portion of the second definition layer is exposed from the third definition layer;
forming a light-emitting material on the plurality of first electrodes, respectively, in the pixel openings; and
forming a second electrode on the light-emitting material, the second electrode being structurally integrated, covering the pixel definition layer, and being electrically connected with the second definition layer.

12. The method of claim 11, wherein forming the pixel definition layer on the base substrate comprises:
forming a first definition film on the base substrate, the first definition film covering an entirety of the base substrate;
forming a second definition film on the first definition film, the second definition film covering an entirety of the first definition film;
coating a photoresist on the second definition film;
exposing and developing the photoresist to form photoresist removal areas corresponding to the pixel openings to be formed; and
etching the second definition film and the first definition film to form the pixel definition layer having the plurality of pixel openings, wherein the plurality of pixel openings expose the plurality of first electrodes.

13. The method of claim 11, wherein forming the pixel definition layer on the base substrate comprises:
forming a first definition film on the base substrate, the first definition film covering the base substrate;
forming a second definition film on the first definition film, the second definition film covering an entirety of the first definition film;
coating a photoresist on the second definition film, and exposing and developing the photoresist to form photoresist removal areas corresponding to the pixel openings to be formed;
etching the first definition film and the second definition film simultaneously to form the first definition layer and the second definition layer; and
forming a third definition film on the second definition layer, and patterning the third definition film to expose at least a portion of the second definition layer.

14. The method of claim 11, wherein the first definition layer comprises a material that is hydrophilic.

15. The method of claim 11, wherein the material of the second definition layer is hydrophobic.

16. The method of claim 11, wherein the light-emitting material is formed by an ink-jet printing process.

17. The method of claim 11, wherein the second definition layer has an electrical resistivity less than that of the second electrode.

* * * * *